United States Patent
Shim et al.

(10) Patent No.: US 8,445,914 B2
(45) Date of Patent: May 21, 2013

(54) DISPLAY SUBSTRATE HAVING A BLACK MATRIX

(75) Inventors: Yi-Seop Shim, Suwon-si (KR); Cheol-Gon Lee, Cheonan-si (KR); Chul Huh, Yongin-si (KR); Yui-Ku Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 204 days.

(21) Appl. No.: 12/894,886

(22) Filed: Sep. 30, 2010

(65) Prior Publication Data

US 2011/0180798 A1 Jul. 28, 2011

(30) Foreign Application Priority Data

Jan. 25, 2010 (KR) .................. 10-2010-0006340

(51) Int. Cl.
  *H01L 29/04* (2006.01)
  *H01L 31/036* (2006.01)
  *G02F 1/1333* (2006.01)

(52) U.S. Cl.
  USPC ......... 257/72; 257/59; 257/E27.111; 349/110

(58) Field of Classification Search
  USPC .................. 257/59, 72, E27.111; 349/43, 46, 349/44, 110
  See application file for complete search history.

(56) References Cited

U.S. PATENT DOCUMENTS

| 2004/0109102 A1 | 6/2004 | Chang et al. | |
| 2005/0139922 A1* | 6/2005 | Kim et al. | 257/347 |
| 2009/0180064 A1* | 7/2009 | Kim et al. | 349/110 |
| 2009/0231304 A1* | 9/2009 | Lee et al. | 345/174 |

FOREIGN PATENT DOCUMENTS

| JP | 2002-287149 A | 10/2002 |
| JP | 2004-126558 A | 4/2004 |
| JP | 2004-334182 A | 11/2004 |
| JP | 2007-199181 A | 8/2007 |
| KR | 1020060075503 A | 7/2006 |
| KR | 1020060079061 A | 7/2006 |
| KR | 1020060115778 A | 11/2006 |
| KR | 1020080032345 A | 4/2008 |
| KR | 1020090059917 A | 6/2009 |
| KR | 1020090084176 A | 8/2009 |

* cited by examiner

*Primary Examiner* — Shouxiang Hu
(74) *Attorney, Agent, or Firm* — Cantor Colburn LLP

(57) ABSTRACT

A display substrate includes a transistor, a black matrix and a color spacer. The transistor is connected to a gate line, and a data line crossing the gate line. The black matrix includes a first light-blocking portion covering the gate line and the data line, and a second light-blocking portion covering a channel of the transistor. The second light-blocking portion has a thickness which is smaller than a thickness of the first light-blocking portion. The color spacer is disposed on the second light-blocking portion.

9 Claims, 6 Drawing Sheets

DISPLAY SUBSTRATE HAVING A BLACK MATRIX

This application claims priority to Korean Patent Application No. 2010-0006340, filed on Jan. 25, 2010, and all the benefits accruing therefrom under 35 U.S.C. §119, the contents of which are herein incorporated by reference in their entirety.

BACKGROUND OF THE INVENTION

1. Field of the Invention

Exemplary embodiments of the invention relate to a display substrate and a method of manufacturing the display substrate. More particularly, exemplary embodiments of the invention relate to a display substrate capable of enhancing display quality and a method of manufacturing the display substrate.

2. Description of the Related Art

Generally, a liquid crystal display ("LCD") includes an LCD panel and a backlight assembly providing light to the LCD panel. The LCD panel includes an array substrate in which a plurality of thin-film transistors ("TFTs") is arranged, a color filter substrate in which a color filter is arranged, and a liquid crystal layer interposed between the array substrate and the color filter substrate. The LCD device displays gradations through transmitting of lights according to a variation of an arrangement of liquid crystals.

A display substrate including the array substrate on which a color filter and a black matrix are formed, has been recently developed in order to enhance an alignment margin and an aperture ratio. In a structure in which the black matrix is formed on the display substrate, the black matrix is opened in accordance with a channel area of a TFT formed on the display substrate. When the black matrix is formed on the channel area of the display substrate, the channel of the TFT is not observed during a repair process of defect pixel of the display substrate. Thus, in order to simplify the repair process, the black matrix is removed in accordance with the channel area.

Accordingly, when the black matrix is removed in the channel area, light leakage is generated through the channel area, and a height of a column spacer is non-uniform due to a stepped difference between the channel area and a peripheral of the channel area. The non-uniform of the column spacer has caused a reduction of a margin of liquid crystal drop and a margin of smear defects. In addition, the stepped difference has caused defects due to a residue in a following process during manufacturing.

BRIEF SUMMARY OF THE INVENTION

Exemplary embodiments of the invention provide a display substrate capable of enhancing structure characteristics and process margin.

Exemplary embodiments of the invention also provide a method of manufacturing the above-mentioned display substrate.

In an exemplary embodiment of the invention, a display substrate includes a transistor, a black matrix and a color spacer. The transistor is connected to a gate line and a data line crossing the gate line. The black matrix includes a first light-blocking portion covering the gate line and the data line, and a second light-blocking portion covering a channel of the transistor. The second light-blocking portion has a thickness that is smaller than a thickness of the first light-blocking portion. The color spacer is disposed on the second light-blocking portion.

In an exemplary embodiment of the invention, there is provided a method of manufacturing a display substrate. In the method, a transistor is formed, which is connected to a gate line, and a data line crossing the gate line. Then, a black matrix is formed, which includes a first light-blocking portion covering the gate line and the data line, and a second light-blocking portion covering a channel of the transistor. The second light-blocking portion has a thickness that is smaller than a thickness of the first light-blocking portion. Then, a color light-blocking portion is formed, which is disposed on the second light-blocking portion.

According to exemplary embodiments of a display substrate and a method of manufacturing the display substrate, a light-blocking portion is formed on a channel area to have a thickness capable of being identified through an infrared light illuminator, so that a repair process of a channel may be easily performed and light leakage of the channel area may be reduced or effectively prevented. Moreover, a light-blocking layer of a relatively thin thickness is formed on the channel area, so that a stepped difference between the channel area and a peripheral of a black matrix is decreased so that a linearization of an organic insulation layer and a color spacer may be easily performed by a following process during manufacturing. Thus, a height of the color spacer disposed on the channel area is uniform, so that a margin of liquid crystal drop, a margin of smear defects, etc., may be enhanced. In addition, defects due to residue may be reduced or effectively prevented during a following process, that is, a forming process of a pixel electrode.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
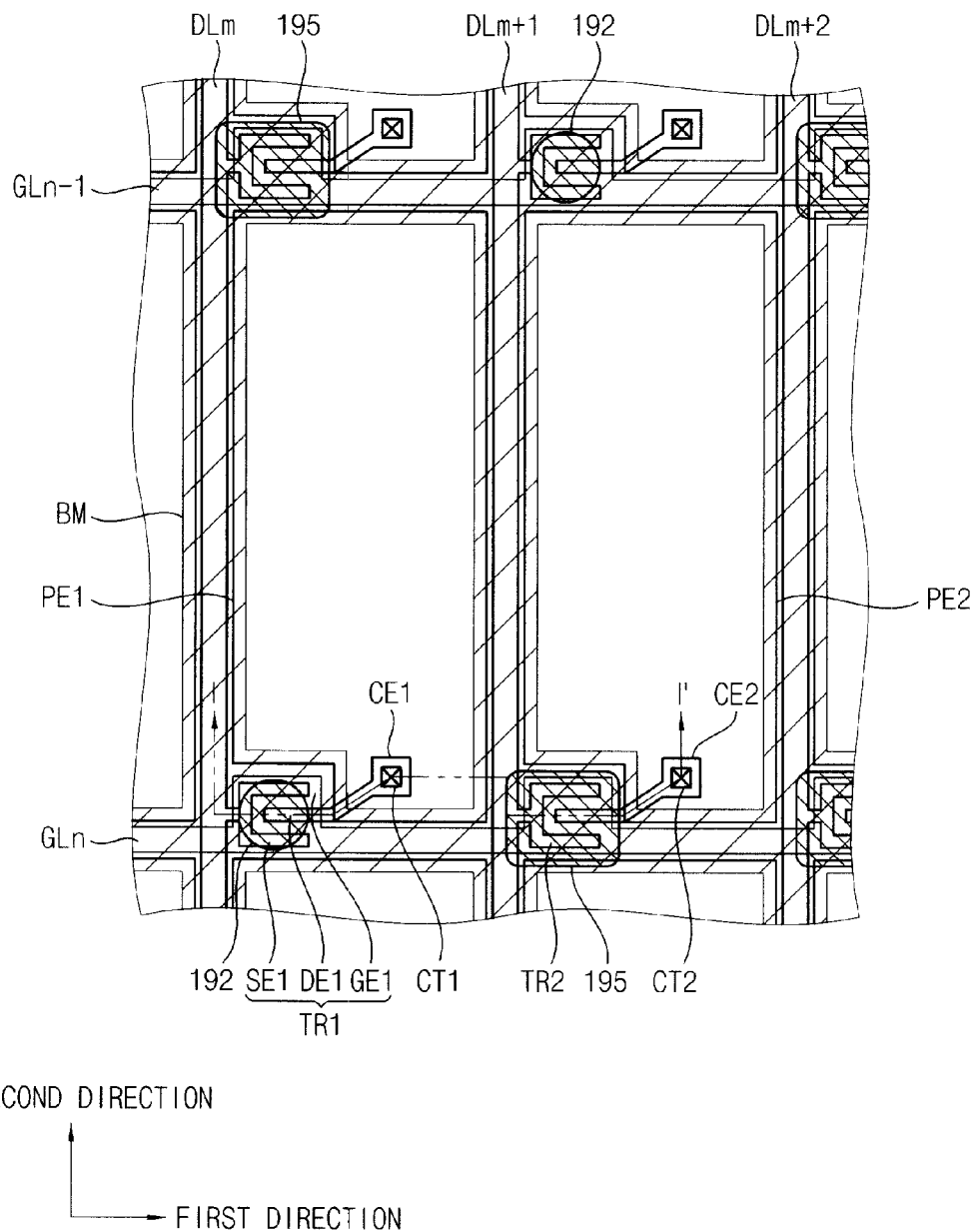
FIG. 1 is a plan view illustrating an exemplary embodiment of a display device according to the invention.

The invention is described more fully hereinafter with reference to the accompanying drawings, in which exemplary embodiments of the invention are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 2:
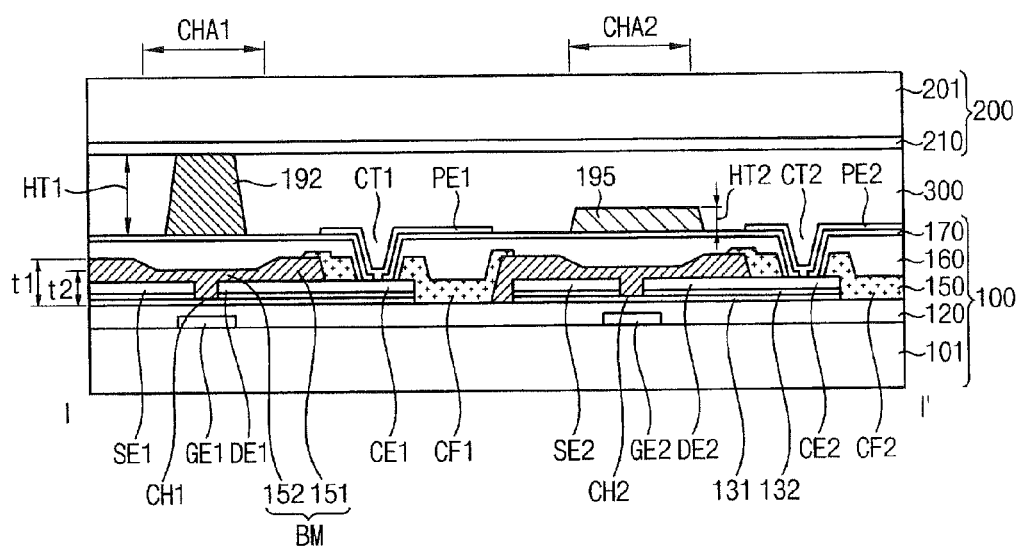
FIG. 2 is a cross-sectional view taken along line I-I' of FIG. 1.

FIG. 1 is a plan view illustrating an exemplary embodiment of a display device according to the invention. FIG. 2 is a cross-sectional view taken along line I-I' of FIG. 1.

Referring to FIGS. 1 and 2, the display device includes a display substrate 100, an opposite substrate 200, and a liquid crystal layer 300 interposed between the display substrate 100 and the opposite substrate 200.

The display substrate 100 includes a first base substrate 101, a first metal pattern, a gate insulation layer 120, a second metal pattern, a black matrix BM, a plurality of color filters CF1 and CF2, an organic insulation layer 160, a protection insulation layer 170, a plurality of pixel electrodes PE1 and PE2, a color spacer 192 and a color light-blocking portion 195.

The first metal pattern is disposed on the first base substrate 101 to include a plurality of gate lines GLn−1 and GLn, and a plurality of gate electrodes GE extending from each of the gate lines GLn−1 and GLn. The gate lines GLn−1 and GLn are longitudinally extended in a first direction, to be arranged in a second direction crossing the first direction. Here, 'n' is a natural number.

The gate insulation layer 120 is disposed directly on an upper surface of the first base substrate 101 to cover the first metal pattern. The gate insulation layer 120 is disposed on substantially an entire of the first base substrate 101, overlapping the first metal pattern in the plan view of the display device, contacting the upper surface of the first base substrate 101, and contacting an upper and side surfaces of the first metal pattern. The gate insulation layer 120 may include an inorganic insulation material. In one exemplary embodiment, the gate insulation layer 120 may include a silicon oxide (SiOx), a silicon nitride (SiNx) or a silicon oxynitride (SiOxNy), although other suitable insulation layers would also be within the scope of these embodiments.

The second metal pattern is disposed on the gate insulation layer 120 to include a plurality of data lines DLm, DLm+1 and DLm+2, a plurality of source electrodes SE1 and SE2 respectively protruded from the data lines DLm and DLm+1, where 'm' is a natural number, and a plurality of drain electrodes DE1 and DE2 respectively spaced apart from the source electrodes SE1 and SE2. Moreover, the second metal pattern may further include a plurality of contact electrodes CE1 and CE2 connected electrically and/or physically to the drain electrodes DE1 and DE2.

The data lines DLm, DLm+1 and DLm+2 are extended in the second direction, and arranged in the first direction. A semiconductor layer 131 and an ohmic contact layer 132 are disposed below the second metal pattern, that is, between the second metal pattern and the first base substrate 101.

A portion, such as an upper surface, of the semiconductor layer 131 is exposed by the source electrodes SE1 and SE2 and the drain electrodes DE1 and DE2. The portion of the semiconductor layer 131 that is exposed by the source electrodes SE1 and SE2 and the drain electrodes DE1 and DE2, may respectively define a plurality of channels CH1 and CH2 of transistors TR1 and TR2.

The black matrix BM includes a first light-blocking portion 151 disposed on and overlapping, an area on which the gate lines GLn−1 and GLn and the data lines DLm, DLm+1 and DLm+2 are disposed, and a second light-blocking portion 152 disposed on and overlapping channel areas CHA1 and CHA2 on which the channels CH1 and CH2 are disposed. The first light-blocking portion 151 is disposed to cover the gate lines GLn−1 and GLn and the data lines DLm, DLm+1 and DLm+2 in a first thickness 't1' with respect to an upper surface of the gate insulation layer 120, and the second light-blocking portion 152 is disposed to cover the channels CH1 and CH2 in a second thickness 't2' with respect to the upper surface of the gate insulation layer 120, the second thickness 't2' being smaller than the first thickness 't1.' The first light-blocking portion 151 and the second light-blocking portion 152 are disposed continuously with each other, forming a unitary single indivisible black matrix BM member.

The first light-blocking portion 151 may block light which has an optical density of no more than about 4.0 due to the gate lines GLn−1 and GLn and the data lines DLm, DLm+1 and DLm+2 disposed below the first light-blocking portion 151. In one exemplary embodiment, the first light-blocking portion 151 includes a light-blocking material having an optical density of about 2.0, according to a thickness of about 1 micrometer (μm), to block lights.

The second light-blocking portion 152 may have an optical density of no more than about 2.7 to observe the channel areas CHA1 and CHA2 through an infrared light illuminator, such as during a repair process. Thus, the second light-blocking portion 152 may include a light-blocking material in a thickness of about 1.0 μm, which has an optical density of about 2.0 according to a thickness of about 1 μm. Thus, the channel areas CHA1 and CHA2 are observable through the infrared light illuminator, and then a repair process of a channel may be performed.

As a result, for the first light-blocking portion 151 to block light which has an optical density of no more than about 4.0, and for the second light-blocking portion 152 to have an optical density of no more than about 2.7 as described above, an exemplary embodiment of the invention includes an optical density of the first light-blocking portion 151 is about 3.6 to about 4.4, and a first thickness 't1' of the first light-blocking portion 151 is about 1.8 μm to about 2.2 μm. An optical density of the second light-blocking portion 152 is about 2.0 to about 2.6, and a second thickness 't2' of the second light-blocking portion 152 is about 1.0 μm to about 1.3 μm. A difference between the first thickness 't1' of the first light-blocking portion 151, and the second thickness 't2' of the second light-blocking portion 152, is about 0.7 μm to about 1 μm. The difference in thickness defines a step difference of the black matrix BM, formed by the second light-blocking portion 152 disposed in the channel areas CHA1 and CHA2, and the first light-blocking portion 151 disposed in the area on which the gate lines GLn−1 and GLn and the data lines DLm, DLm+1 and DLm+2 are disposed (e.g., a peripheral area of the black matrix BM).

Referring again to FIGS. 1 and 2, the color filters CF1 and CF2 are disposed on and overlapping a portion of an area exposed by the black matrix BM, that is, a light transmissive area of the first base substrate 101. The color filters CF1 and CF2 may convert lights (e.g., non-colored lights) transmitted through the light-transmitting area of the first base substrate 101 into color lights. A first hole H1 may be disposed extending completely through first color filter CF1 in an area overlapping with first contact electrode CE1, and exposing an upper surface of the first contact electrode CE1. A second hole H2 may be disposed extending completely through second color filter CF2 in an area overlapping with a second contact electrode CE2, and exposing an upper surface of the second contact electrode CE2.

The organic insulation layer 160 is disposed on the first base substrate 101 to cover and overlap both the black matrix BM and the color filters CF1 and CF2. The organic insulation layer 160 may be respectively disposed directly contacting upper surfaces and/or side surfaces of the matrix BM, the color filters CF1 and CF2, and/or the contact electrodes CE1 and CE2. The stepped difference, taken in a third direction orthogonal to the first and second directions, between the first and second light-blocking portions 151 and 152 may be about 0.7 μm to about 1 μm. However, the stepped difference in an area of the first and second light-blocking portions 151 and 152 may be effectively removed or compensated by the organic insulation layer 160 including a planar upper surface.

The protection insulation layer 170 is disposed directly on the organic insulation layer 160, and a plurality of contact holes CT1 and CT2 is disposed in accordance with (e.g., aligned with) the holes H1 and H2 in the first and second color filters CF1 and CF2. The protection insulation layer 170 may include an inorganic insulation material. The inorganic insulation material may include a silicon oxide (SiOx) or a silicon nitride (SiNx), although other suitable inorganic insulation layers would also be within the scope of these embodiments.

The pixel electrodes PE1 and PE may include an optically transparent and electrically conductive material. The pixel electrodes PE1 and PE2 are electrically connected to the transistors TR1 and TR2 through the contact holes CT1 and CT2, respectively.

The color spacer 192 may maintain an interval between the display substrate 100 and the opposite substrate 200 in a uniform manner. The color spacer 192 is disposed on the first channel area CHA1 of a first transistor TR1, that is, overlapping the second light-blocking portion 152. The second light-blocking portion 152, which has the second thickness 't2' smaller than the first thickness 't1' of the first light-blocking portion 151, is disposed on the first and second channel areas CHA1 and CHA2, so that a stepped difference due to the first and second light-blocking portions 151 and 152 may be covered by the color filters CF1 and CF2 and/or the organic insulation layer 160. Thus, since the color filters CF1 and CF2 and/or the organic insulation layer 160 removes or compensates for the stepped difference between the first and second light-blocking portions 151 and 152, a plurality of color spacers 192 disposed on the second light-blocking portion 152 may be disposed in substantially a uniform height. The color spacers 192 have a uniform height, so that margins of liquid crystal drop and smear defects may be enhanced.

According to the illustrated exemplary embodiment, an additional metal pattern for planarizing a lower layer of an area on which the color spacers 192 are disposed is omitted in a light-transmitting area of the display device, so that an aperture ratio of the display substrate 100 may be enhanced.

Referring again to FIGS. 1 and 2, the display substrate 100 may further include the color light-blocking portion 195. The color light-blocking portion 195 is disposed on a second channel area CHA2 on which the color spacer 192 is not disposed, to prevent light leakage of the second channel area CHA2. The color light-blocking portion 195 is disposed overlapping the second light-blocking portion to block a color light. The color spacer 192 is disposed to have a first height HT1 with respect to a lowermost surface of the opposite substrate and an upper most surface of the display substrate 100. The color light-blocking portion 195 is disposed to have a second height HT2 that is smaller than the first height HT1 in consideration of a cell gap of the liquid crystal layer 300 and a margin of an amount of liquid crystal, with respect to the lowermost surface of the opposite substrate and the uppermost surface of the display substrate 100. In one exemplary embodiment, the first height HT1 of the color spacer 192 is about 2.0 μm to about 4.0 μm, and the second height HT2 of the color light-blocking portion 195 is about 1.0 μm to about 2.0 μm. That is, the first height HT1 of the color spacer 192 is significantly larger (e.g., twice a size) as the second height HT2 of the color light-blocking portion 195.

In exemplary embodiments, a thickness (e.g., height) of the color light-blocking portion 195 may be no more than about 2.0 μm. When the color light-blocking portion 195 includes a light-blocking material as in a thickness of about 2.0 μm, which has an optical density of about 1.2 in accordance with a thickness of about 1 μm, an optical density of the color light-blocking portion 195 may be about 2.4. Thus, since an optical density of the second light-blocking portion 152 is about 2.0 to about 2.7, and an optical density of the color light-blocking portion 195 is about 2.4, a total optical density of the second light-blocking portion 152 and the color light-blocking portion 195 on the second channel area CHA2 is no less than about 4.0, so that light leakage of the second channel area CHA2 may be reduced or effectively prevented. In one exemplary embodiment, an optical density of the color light-blocking portion 195 may be about 2.0 to about 4.0.

The opposite substrate 200 includes a second base substrate 201 and a common electrode 210. The common electrode 210 is disposed substantially overlapping an entire of the second base substrate 201 in the plan view of the display device.

The liquid crystal layer 300 is disposed between the display substrate 100 and the opposite substrate 200. The liquid crystal layer 300 includes liquid crystals. An alignment angle of the liquid crystals is altered in accordance with a voltage difference between the pixel electrode PE1 and the common electrode 210, and the pixel electrode PE2 and the common electrode 210, to control light transmittance.

In the illustrated exemplary embodiments described above, a second light-blocking portion 152 is disposed in channel areas to have a thickness capable of being identified through an infrared light illuminator, so that a repair process of a channel may be easily performed and light leakage of the channel area may be prevented. The color light-blocking portion 195 is disposed on a channel area to reduce or effectively prevent light leakage of the channel area. Finally, the color filters and/or the organic insulation layer remove or compensate for the stepped difference between light-blocking portions, and a plurality of spacers is disposed on the second light-blocking portion 152 in substantially a uniform height, so that margins of liquid crystal drop and smear defects may be enhanced.

FIGS. 3A to 3I are cross-sectional views and plan views explaining an exemplary embodiment of a method of manufacturing the display substrate of FIGS. 1 and 2.

Figure 3A:
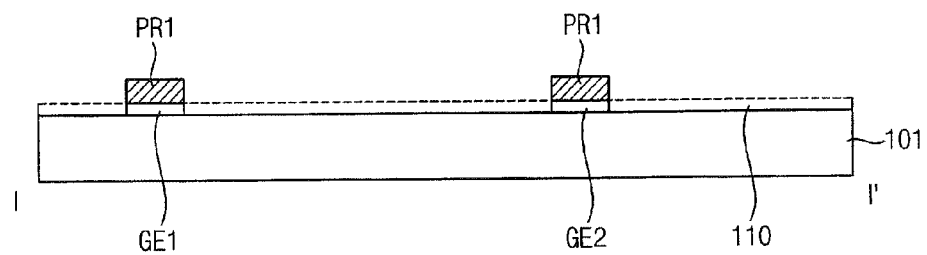
FIGS. 3A to 3I are cross-sectional views and plan views explaining an exemplary embodiment of a method of manufacturing the display substrate of FIGS. 1 and 2.

Referring to FIGS. 2 and 3A, a first metal layer 110 is formed on a first base substrate 101. A first photo mask pattern PR1 is formed on the first metal layer 110, using a photo resist material. The first photo mask pattern PR1 is formed in correspondence with an area on which the gate lines GLn−1 and GLn and the gate electrodes GE1 and GE2 are formed. Here, 'n' is a natural number. As used herein, "corresponding" or "correspondence with" indicates related or aligned in size, shape, positional placement, etc. relative to another element.

The first metal layer 110 (indicated by the dotted lines in FIG. 3A) is patterned to form the first metal pattern by using the first photo mask pattern PR1. The first metal pattern includes the gate lines GLn−1 and GLn and the gate electrodes GE1 and GE2.

Figure 3B:
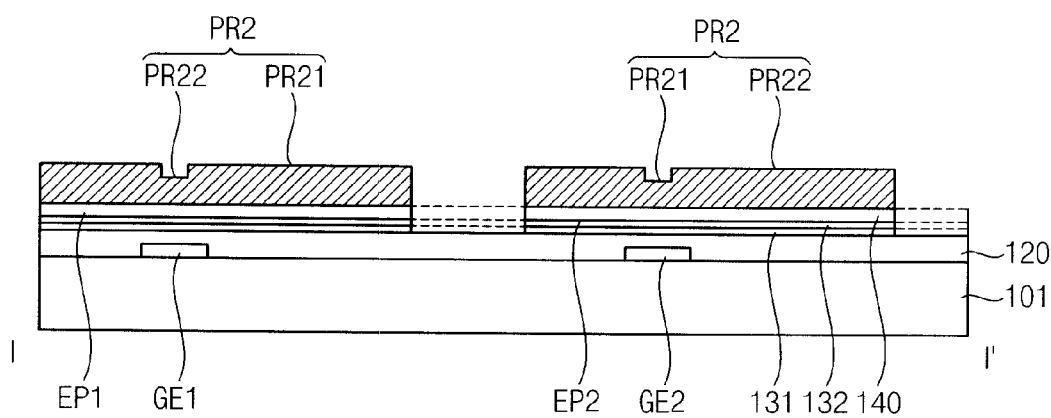

Referring to FIGS. 2 and 3B, a semiconductor layer 131, an ohmic contact layer 132 and a second metal layer 140 (indicated by the dotted lines in FIG. 3B) are sequentially formed on the first base substrate 101, on which the first metal pattern and a gate insulating layer 120 are previously formed. A second photo mask pattern PR2 is formed on the first base substrate 101 on which the second metal layer 140, is formed by using a photo resist material.

The second photo mask pattern PR2 is formed overlapping the data lines DLm, DLm+1 and DLm+2, the source electrodes SE1 and SE2, the drain electrodes DE1 and DE2 and the contact electrodes CE1 and CE2. The second photo mask pattern PR2 includes a first photo pattern PR21, and a second photo pattern PR22 having a thickness smaller than that of the first photo pattern PR21. The first photo pattern PR21 is disposed on the data lines DLm, DLm+1 and DLm+2, the source electrodes SE1 and SE2, the drain electrodes DE1 and DE2 and the contact electrodes CE1 and CE2, and the second photo pattern PR22 is disposed on the channel areas CHA1 and CHA2 on which the channels CH1 and CH2 are formed.

The second metal layer 140, the ohmic contact layer 132 and the semiconductor layer 131 are simultaneously patterned by using the second photo mask pattern PR2, to form a second metal pattern. The second metal pattern includes electrode patterns EP1 and EP2, and the data lines DLm, DLm+1 and DLm+2. The electrode patterns EP1 and EP2 and the data lines DLm, DLm+1 and DLm+2 respectively include the ohmic contact layer 132 and the semiconductor layer 131 that are patterned.

Figure 3C:
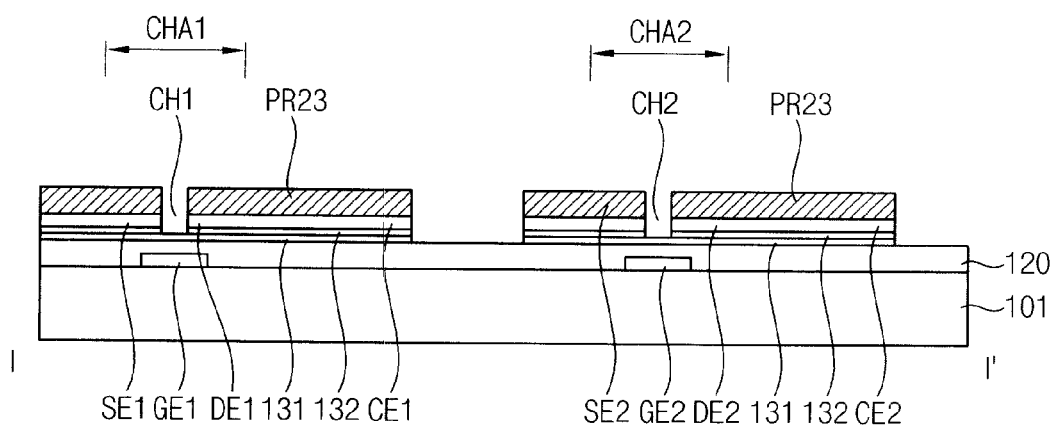

Referring to FIGS. 2 and 3C, predetermined thicknesses of the first photo pattern PR21 and the second photo pattern PR22 are removed to expose the electrode patterns EP1 and EP2 corresponding to the channel areas CHA1 and CHA2. A third photo pattern PR23 is effectively formed by the reduced thickness first and second photo patterns PR21 and PR 22, on the electrode patterns EP1 and EP2 corresponding to the channel areas CHA1 and CHA2, and the data lines DLm, DLm+1 and DLm+2.

The electrode patterns EP1 and EP2 of the channel areas CHA1 and CHA2 are respectively removed by using the third photo pattern PR23 to form the source electrodes SE1 and SE2, the drain electrodes DE1 and DE2 and the contact electrodes CE1 and CE2. Each of the source electrodes SE1 and SE2 is respectively spaced apart from the drain electrodes DE1 and DE2. Then, portions of the ohmic contact layer 132 of the channel areas CHA1 and CHA2, which are exposed by the source electrodes SE1 and SE2 and the drain electrodes DE1 and DE2, are removed to form channels CH1 and CH2 of the transistors TR1 and TR2.

Figure 3D:
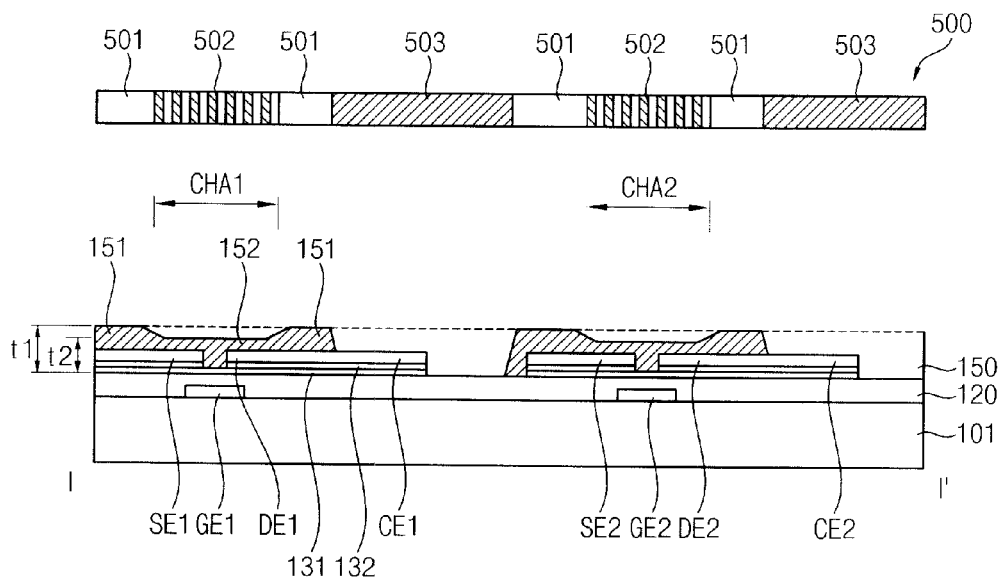

Referring to FIGS. 2 and 3D, a light-blocking layer 150 (indicated by the dotted lines in FIG. 3D) is formed on the first base substrate 101 on which the channels CH1 and CH2 are formed. The light-blocking layer 150 is patterned by using a mask 500 to form a black matrix BM. The mask 500 includes a light-transmitting portion 501, a semi-light-transmitting portion 502 and a light-blocking portion 503. The light-transmitting portion 501 is positioned at an area corresponding to the gate lines GLn−1 and GLn and the data lines DLm, DLm+1 and DLm+2, the semi-light-transmitting portion 502 is positioned at an area corresponding to the channel areas CHA1 and CHA2, and the light-blocking portion 503 is positioned at an area on which the black matrix BM is not formed, that is, a light-transmitting area of the first base substrate 101. The semi-light-transmitting portion 502 may use a slit mask or a half-tone mask.

The light-blocking layer 150 is patterned by using the mask 500 to form the black matrix BM including a first light-blocking portion 151 having a first thickness 't1' and a second light-blocking portion 152 having a second thickness 't2' that is smaller than the first thickness 't1.'

The first light-blocking portion 151 is formed in a first thickness 't1' with respect to an upper surface of the gate insulation layer 120 to cover the gate lines GLn−1 and GLn and the data lines DLm, DLm+1 and DLm+2. The second light-blocking portion 152 is formed in a second thickness 't2' that is smaller than the first thickness 't1' with respect to the upper surface of the gate insulation layer 120 to cover a channel area CHA of the transistor TR.

An optical density of the first light-blocking portion 151 is about 3.6 to about 4.4, and the first thickness 't1' is about 1.8 μm to about 2.2 μm. An optical density of the second light-blocking portion 152 is about 2.0 to about 2.6, and the second thickness 't2' is about 1.0 μm to about 1.3 μm. A difference (e.g., stepped difference) between the first thickness 't1' of the first light-blocking portion 151 and the second thickness 't2' of the second light-blocking portion 152 may be about 0.7 μm to about 1 μm.

When an optical density of the first light-blocking portion 151 is no less than about 4.0, the first light-blocking portion 151 may block lights due to an effect of the gate lines GLn−1 and GLn and the data lines DLm, DLm+1 and DLm+2 that are formed below the first light-blocking portion 151. In one exemplary embodiment, the first light-blocking portion 151 may be formed from a light-blocking material as in a thickness of about 2 μm, which has an optical density of about 2.0 according to a thickness of about 1 μm. Thus, the first light-blocking portion 151 has an optical density of about 4.0, so that lights may be blocked. The second light-blocking portion 152 may have an optical density of no more than about 2.7 to observe the channel areas CHA1 and CHA2 through an infrared light illuminator. Thus, the second light-blocking portion 152 may be formed from a light-blocking material as in a thickness of about 1.0 μm, which has an optical density of about 2.0 according to a thickness of about 1 μm. Accordingly, the channel areas CHA1 and CHA2 may be observed through the infrared light illuminator, so that a repair process of a channel may be performed.

Figure 3E:
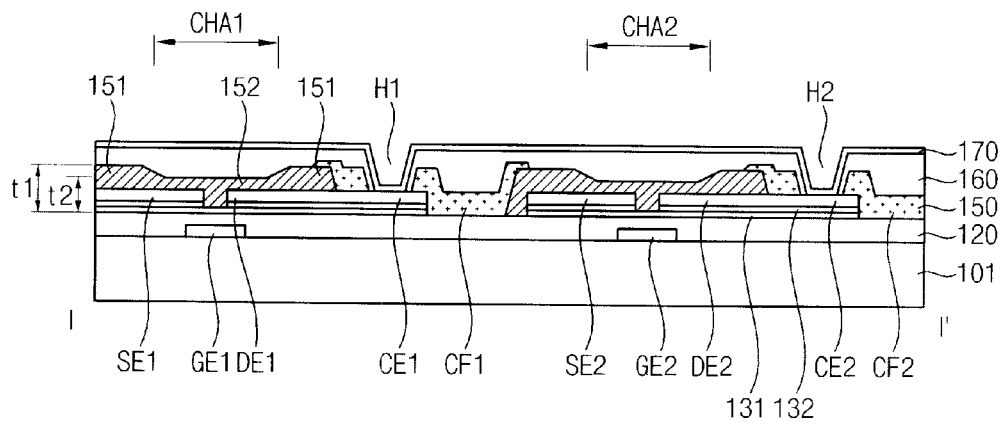

Referring to FIGS. 2 and 3E, a first color photoresist layer is formed on the first base substrate 101 on which the black matrix BM is formed, and then the first color photoresist layer is patterned to form a first color filter CF1. A first hole H1 may be formed through the first color filter CF1 in correspondence with a first contact electrode CE1. A second color photoresist layer is formed on the first base substrate 101 on which the first color filter CF1 is formed, and then the second color photoresist layer is patterned to form a second color filter CF2. A second hole H2 may be formed through the second color filter CF2 in correspondence with a second contact electrode CE2.

An organic insulation layer 160 is formed on the first base substrate 101 on which the color filters CF1 and CF2 are formed. A plurality of holes aligned with holes H1 and H2 may be formed through the organic insulation layer 160, and corresponding to the contact electrodes CE1 and CE2. The organic insulation layer 160 may planarize an uneven upper surface of the first base substrate 101 which is formed by the black matrix BM and the color filters CF1 and CF2. Where the stepped difference may be formed between the first and second light-blocking portions 151 and 152, the stepped difference may be removed by the planarizing organic insulation layer 160.

A protection insulation layer 170 is formed on the first base substrate 101 on which the organic insulation layer 160 is formed. The protection insulation layer 170 is etched to form a plurality of contact holes CT1 and CT2 exposing the contact electrodes CE1 and CE2.

Figure 3F:
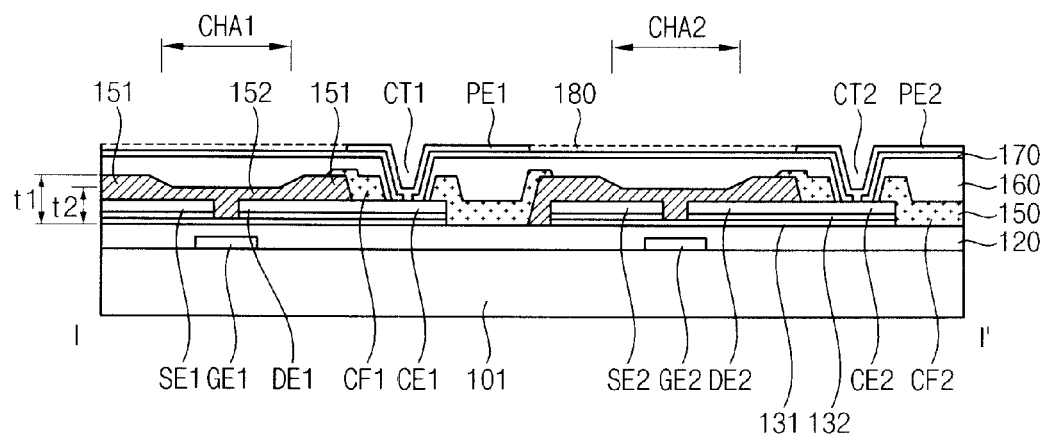

Referring to FIGS. 2 and 3F, a transparent conductive layer 180 is formed on the first base substrate 101 having the contact holes CT1 and CT2 formed therethrough, and the transparent conductive layer 180 is patterned to form a plurality of pixel electrodes PE1 and PE2. In a process of patterning the pixel electrodes PE1 and PE2, the channel areas CHA1 and CHA2 are planarized by the organic insulation layer 160, so that a removing of the transparent conductive layer 180 (indicated by the dotted lines) may be easily realized. Thus, defects generated due to a remaining of the transparent conductive layer 180 on the channel areas CHA1 and CHA2, may be reduced or effectively prevented.

The pixel electrodes PE1 and PE2 contact with the contact electrodes CE1 and CE2 through the contact holes CT1 and CT2. Thus, the pixel electrodes PE1 and PE2 may be electrically connected to the transistors TR1 and TR2.

Figure 3G:
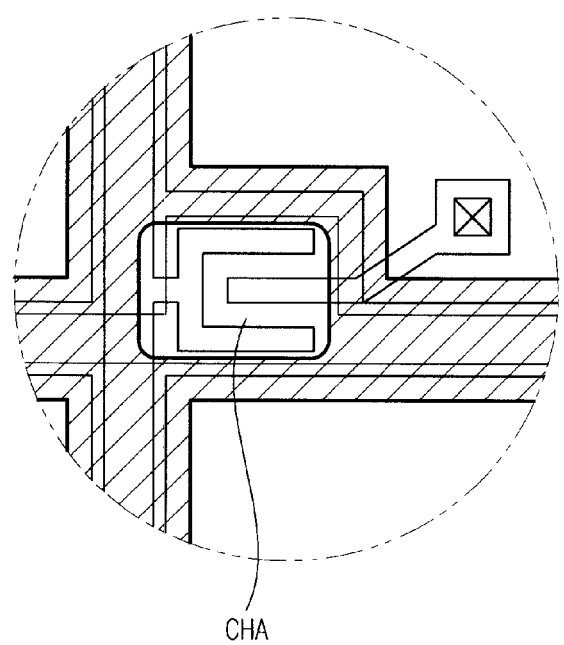
Figure 3H:
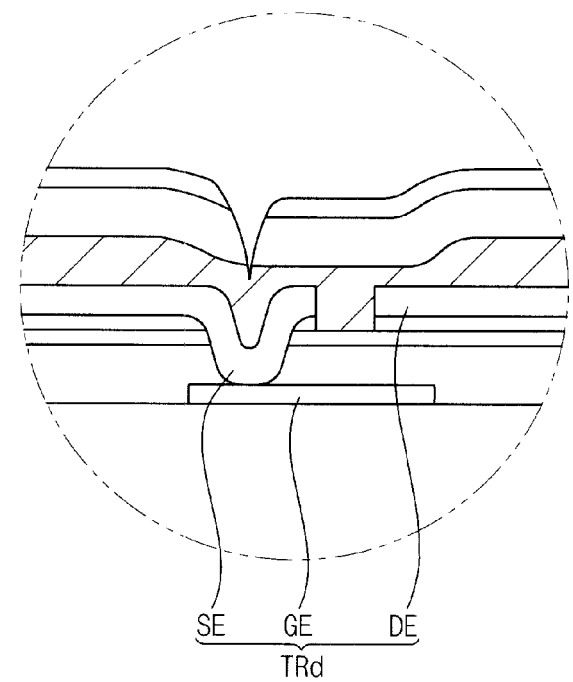

Referring to FIGS. 2, 3G and 3H, a test process, in which an electric signal is applied to the display substrate 100 on which the pixel electrodes PE1 and PE2 are formed, is performed to test whether the pixel electrodes PE1 and PE2 of the display substrate 101 are normally operated or not. A defect pixel DAP which is abnormally operated is detected through the test process, and a repair process repairing the defect pixel DAP is performed.

In one exemplary embodiment of a test process, a plurality of test signals is applied to a plurality of gate lines and a plurality of data lines that are formed on the display substrate 100, to test whether or not the test signal is normally applied to the pixel electrodes. Through the test process, a defect pixel DAP may be detected, which has a pixel electrode in which the test signal is not normally applied thereto.

When the defect pixel DAP is detected, a tester may identify a channel area CHA of the defect pixel DAP via the second light-blocking portion 152 having a thin thickness, such as by using an infrared light illuminator. The second light-blocking portion 152 formed on the channel area CHA has the second thickness 't2' and an optical density of no more than about 2.7, so that the test may identify the gate electrode GE, the source electrode SE and the drain electrode DE formed on the channel area CHA through the infrared light illuminator. Thus, the tester performs a repair process. In the repair process, the channel CH of the defect pixel DAP identified through the infrared light illuminator is forcibly short-circuited, so that the defect pixel DAP does not operate any more.

Figure 3I:
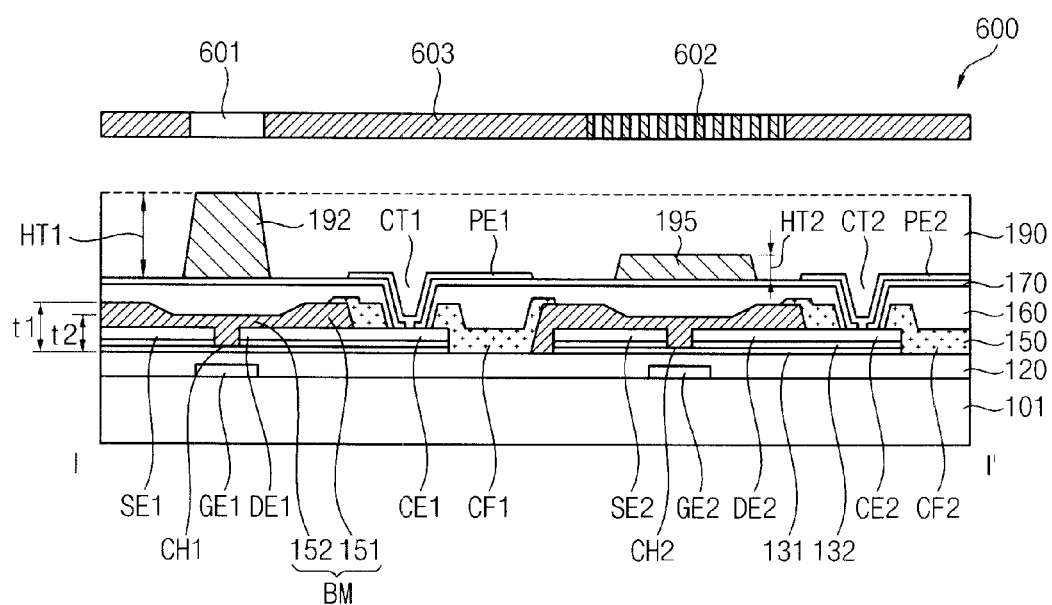

Referring to FIGS. 2 and 3I, after the repair process is performed, a color organic layer 190 (indicated by dotted lines) is formed on the first base substrate 101 on which the pixel electrodes PE1 and PE2 are formed.

A mask 600 having a light-transmitting portion 601, a semi-light-transmitting portion 602 and a light-blocking portion 603 is disposed on the first base substrate 101 in which the color organic layer 190 is formed to pattern the color organic layer 190. The light-transmitting portion 601 is positioned on the first channel area CHA1, the semi-light-transmitting portion 602 is positioned on the second channel area CHA2, and the light-blocking portion 603 is positioned on an area in which the color organic layer 190 is removed. The semi-light-transmitting portion 602 may include a slit mask or a half-tone mask.

As the color organic layer 190 is patterned by using the mask 600, the color spacer 192 is formed on the first channel area CHA1, and the color light-blocking portion 195 is formed on the second channel area CHA2. The color spacer 192 is formed in a first height HT1, and the color light-blocking portion 195 is formed in a second height HT2 that is smaller than the first height HT1 in consideration with a cell gap of the liquid crystal layer 300, a margin of an amount of liquid crystal, etc. The first height HT1 of the color spacer 192 is about 2.0 µm to about 4.0 µm, and the second height HT2 of the color light-blocking portion 195 is about 1.0 µm to about 2.0 µm.

When the color light-blocking portion 195 is formed from a light-blocking material as in a thickness of about 2.0 µm, where the light-blocking material has an optical density of about 1.2 in accordance with a thickness of about 1 µm, an optical density of the color light-blocking portion 195 may be about 2.4. Thus, since an optical density of the second light-blocking portion 152 is about 2.0 to about 2.7, and an optical density of the color light-blocking portion 195 is about 2.4, a total optical density of the second light-blocking portion 152 and the color light-blocking portion 195 on the channel area CHA is no less than about 4.0, so that light leakage of the channel area CHA may be reduced or effectively prevented. In one exemplary embodiment, an optical density of the color light-blocking portion 195 may be about 2.0 to about 4.0.

As described above, a light-blocking portion is formed on a channel area to have a thickness capable of being identified through an infrared light illuminator, so that a repair process of a channel may be easily performed and light leakage of the channel area may be prevented. Moreover, a light-blocking layer of a thin thickness is formed on the channel area, so that a stepped difference between the channel area and a peripheral of a black matrix is decreased so that a planarization of an organic insulation layer and a color spacer may be easily performed by the following process. Thus, a height of the color spacer disposed on the channel area is uniform, so that a margin of liquid crystal drop, a margin of smear defects, etc., may be enhanced. In addition, defects due to residue may be reduced or effectively prevented during a following manufacturing process, that is, a forming process of a pixel electrode.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
    a transistor connected to a gate line, and a data line crossing the gate line, on a base substrate;
    a black matrix comprising:
        a first light-blocking portion overlapping the gate line and the data line; and
        a second light-blocking portion overlapping a channel of the transistor, the second light-blocking portion having a height which is smaller than a height of the first light-blocking portion, the heights taken with respect to the base substrate; and
    a color spacer disposed overlapping the second light-blocking portion.

2. The display substrate of claim 1, wherein the first light-blocking portion has an optical density blocking lights.

3. The display substrate of claim 2, wherein
    the second light-blocking portion includes a material identical to the first light-blocking portion, and
    the height of the second light-blocking portion is identifiable through an infrared light illuminator.

4. The display substrate of claim 1, wherein the height of the first light-blocking portion is about 1.8 micrometers (µm) to about 2.2 micrometers (µm), and an optical density of the first light-blocking portion is about 3.6 to about 4.4.

5. The display substrate of claim 4, wherein the height of the second light-blocking portion is about 1.0 µm to about 1.3 µm, and an optical density of the second light-blocking portion is about 2.0 to about 2.6.

6. The display substrate of claim 1, further comprising a color light-blocking portion disposed overlapping the second light-blocking portion to block a color light.

7. The display substrate of claim 6, wherein
    the color light-blocking portion includes a material identical to the color spacer, and
    a height of the color light-blocking portion is substantially smaller than a height of the color spacer.

8. The display substrate of claim 7, wherein a total sum of an optical density of the second light-blocking portion and an optical density of the color light-blocking portion is a total optical density capable of blocking lights.

9. The display substrate of claim 6, wherein an optical density of the color light-blocking portion is about 2.0 to about 4.0.

* * * * *